United States Patent [19]

Lin

[11] Patent Number: 5,663,983

[45] Date of Patent: Sep. 2, 1997

[54] DIFFERENTIALLY MATCHED FILTER FOR A SPREAD SPECTRUM SYSTEM

[75] Inventor: Wen-Chang Lin, Hsinchu, Taiwan

[73] Assignee: Industrial Technology Research Institute, Hsinchu, Taiwan

[21] Appl. No.: 400,144

[22] Filed: Mar. 7, 1995

[51] Int. Cl.$^6$ ............... H04B 15/00; H04K 1/00; H04L 27/30

[52] U.S. Cl. ............... 375/207; 375/230; 375/232; 375/233

[58] Field of Search ............... 375/230, 231, 375/232, 233, 207

[56] References Cited

U.S. PATENT DOCUMENTS

| | | | |
|---|---|---|---|
| 4,016,410 | 4/1977 | Eggermont | 235/156 |
| 5,224,123 | 6/1993 | Iga et al. | 375/14 |
| 5,418,817 | 5/1995 | Richter | 375/232 |
| 5,436,928 | 7/1995 | Fukuawa et al. | 375/232 |
| 5,499,268 | 3/1996 | Takahashi | 375/231 |

OTHER PUBLICATIONS

"Spread Spectrum Communications" by M.K. Simon, J.K. Omura, R.A. Scholtz, and B.K. Levitt, vol. III, 1 printed by Library of Congress Cataloging in Publication Data 1985, pp. 66–75.

"Simplified Matched Filter Receiver Design for Spread Spectrum Communications Application" by G.J.R. Povey and P.M. Grant, Electronics & Comm. Engineering Journal, Apr. 1993, pp. 59–64.

"Digital Communications and Spread Spectrum Systems" by R.Z. Ziemen and R.L. Peterson, 1985, pp. 385–387.

*Primary Examiner*—Stephen Chin
*Assistant Examiner*—Mohammad Ghayour
*Attorney, Agent, or Firm*—Barnes, Kisselle, Raisch, Choate, Whittemore & Hulbert, P.C.

[57] ABSTRACT

A differentially matched filter for spread spectrum or code division multiple access communication systems comprises a delay line, a multiplication stage, two adders, and an additional delay element. In one embodiment, the delay line comprises elements of delay T with taps therebetween connected to respective elements of the multiplication stage. In another embodiment, the delay line comprises elements of delay T/M with taps after each Mth element connected to respective elements of the multiplication stage. The multiplication stage is connected to a first adder connected in turn to a first input of a second adder. The output of the second adder is the output of the filter and is also connected through the additional delay element to a second input of the second adder, to produce an output sequence. Also disclosed is a method of filtering spread signals at a receiving side of a transmission system comprising the steps of fixing a received sequence of spread signals in a delay line; multiplying successive or predetermined values of the received sequence by respective weighting coefficients constituting a second code sequence that is a replica to a first code sequence used for coding a base band signal at a transmitting side of the system; adding together products of the multiplication, to produce an output sequence; delaying the output sequence for a time of delay equal to delay of one element of the delay line to produce a delayed output sequence; and adding the output sequence to the delayed output sequence.

6 Claims, 2 Drawing Sheets

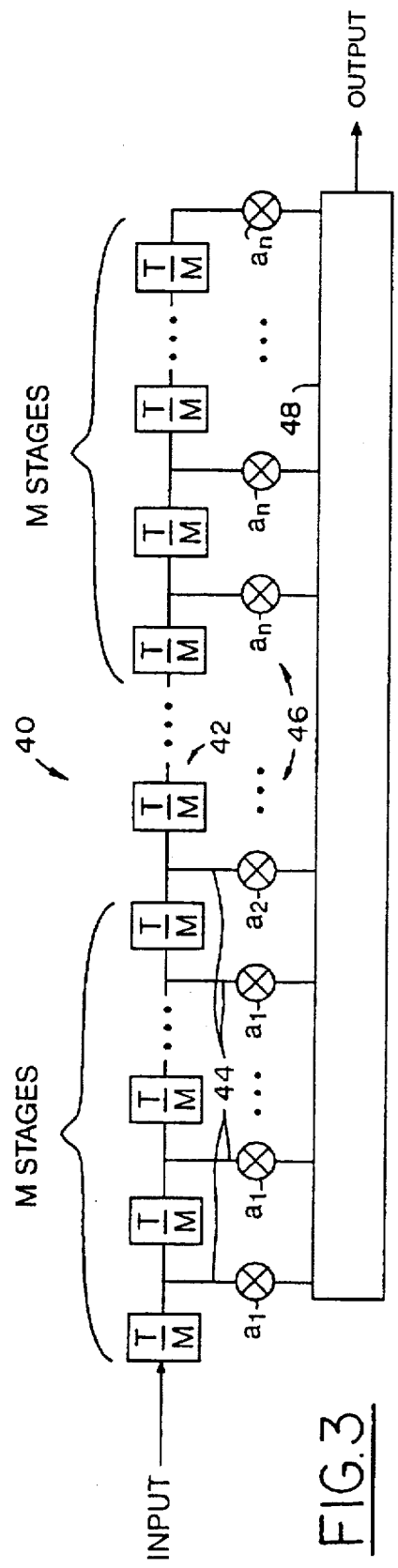
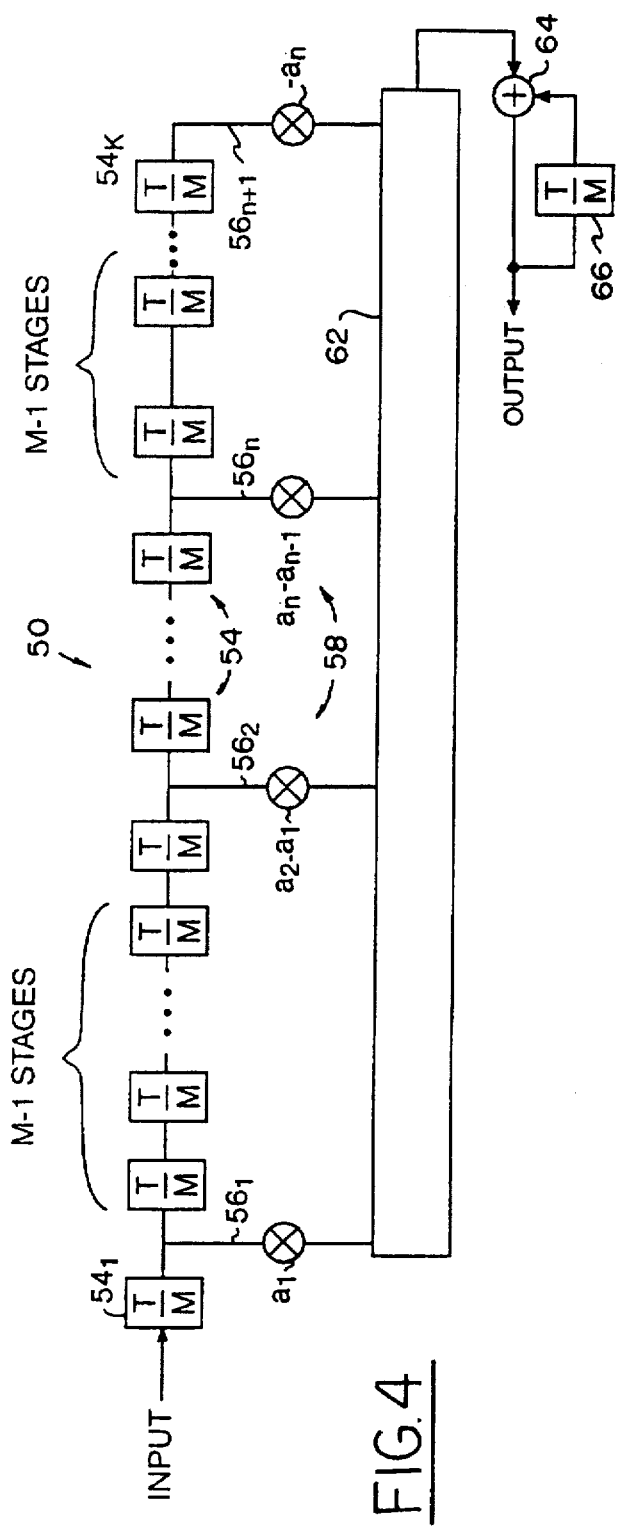
FIG.3
FIG.4

DIFFERENTIALLY MATCHED FILTER FOR A SPREAD SPECTRUM SYSTEM

FIELD OF THE INVENTION

The present invention generally relates to a matched filter used in a spread spectrum (SS) or code division multiple access (CDMA) communication system and more particularly, relates to a filter for a SS or CDMA system having differential filtering features.

BACKGROUND OF THE INVENTION

In a SS or CDMA communication system, a signal to be transmitted covers a very widely spread frequency band as opposed to the ranges used in conventional communication systems and, therefore, less subjected to influence by noise. This and other advantages of the SS or CDMA communication systems have made them very attractive for consumers and made consumers reconsider their positions, especially as complicated arrangements and high costs of SS or CDMA communication systems became things of the past with the advent of technology improvements.

In a SS or CDMA communication system, a series of codes with a predetermined high bit rate, for example a pseudo random noise code series, is used for what is called the spread spectrum modulation of a carrier wave with narrow frequency band obtained by modulating information to be transmitted by a base band signal. The spread spectrum modulation can be exercised by different methods, a direct sequence method including. The direct sequence method provides for modulating a binary code with noise-like qualities on to a carrier. The spread signal is thereby obtained. The most desirable selection of a secure code requires, a long sequence, and a long sequence will require long acquisition time at the receiving side.

In the system of the kind discussed, a receiver is provided with a demodulator to demodulate the incoming spread signals. This operation is dependent on having at the receiving side a replica (or a match, or a pattern) of the pseudo random noise code sequence which is being transmitted. The replica should be in phase with the incoming sequence. Every time the coded pattern of the spread signal corresponds to the pattern, or more specifically, when the pattern is matched with the pseudo random noise code pattern at the time the digital signal is modulated to the spread signal, the spread signal is picked up as the information signal and is transferred to a further processing. Only the interrelating components of the transmitted signals are obtained in this case, since the received signal is multiplied by the pseudo random noise code in perfect analogy with that in the modulation inasmuch as there is no interrelation between different pseudo random noise codes. The above mentioned acquisition time is lengthy since the incoming sequence must be phase and code searched until correlation is attained. Phase searching extends acquisition time.

The process of phase searching can be expedited using tapped delay lines or matched filters. This filter is one of the most important component of a SS and CDMA communication system. In a conventional matched filter, in order to match the increase in length of a random sequence, the number of additions must also be increased. With the increase in the number of additions, the speed of passing the random sequence therethrough becomes limited and should now be increased since it affects the processing time of the system. In order to maintain an acceptable processing time, the speed of passing through the additions must be increased which in turn increases the energy consumption of the system and decreases its efficiency.

In a SS System or a CDMA system, there are different ways of performing code acquisition. These include the use of a correlator and a matched filter. A correlator proper that can be referred to as an active correlator has a simple structure and provides for multiplication of the received pseudo noise signal with noise by the pseudo noise reference at the receiving side and further integration, the result of which integration is used for making an acquisition decision by comparison with a threshold. An active correlator has a basic limitation on the search speed due to a specificity of the multiply-and-integrate type of correlation.

However, the search rate of a direct sequence code acquisition technique can be significantly increased by replacing the multiply-and-integrate operation with a passive correlator device such as a matched filter. A matched filter has a similar architecture as that of a finite impulse response (FIR) tapped-delay-line, or transversal filter. A matched filtering can be implemented either as a continuous time or discrete time operation using such state-of-the-art technologies as charge coupled devices, surface acoustic wave structures, and MOS structures. Generically, a matched filter is a passive device that maximizes the signal-to-noise ratio at its output when the signal at its input is embedded in additive white Gaussian noise. The use of matched filters is described in the art, for instance, in M. K. Simon, J. K. Omura, R. A. Scholtz, and B. K. Levitt "Spread Spectrum Communications" Vol. III, 1 printed by Library of Congress Cataloging in Publication Data 1985.

Conceptually, the implementation of a matched filter acquisition system for a finite length pseudo noise waveform can be visualized in the form of a tapped delay line followed by a passive filter matched to a single pseudo noise chip waveform. The architecture of a conventional matched filter 10 shown in FIG. 1 includes a delay line $12_1, 12_2, \ldots, 12_n, 12_{n+1}$ with taps to a multiplication stage $14_1, 14_2, \ldots, 14_{n-1}, 14_n$, and an adder 16. It can be appreciated that a square block T is the delay of T; $X_1, X_2, \ldots, X_n, X_{n+1}$ is the input sequence, and $a_1 \ldots a_{n-1}, a_n$ is the random code. A digital implementation of a matched filter uses a shift register, a holding register loaded with the random code, and a comparison and summation block. In this case, the contents of the shift register which holds the signal samples digitized to k bits, k an integer, and of the holding register which permanently contains the fixed segment of the code used for comparison are multiplied by each other stage by stage, generating "$x_i$", i=1~n, if the stages match and "$-x_i$", i=1~n, if they don't, and summing the resulting set of "$x_i$" or "$-x_i$", i=1~n. The larger is the value of n the random code sequence, the longer the addition is performed. In the technology of SS or CDNA communication, the length n of a matched filter may exceed 1000 elements of delay in the delay line. A considerable number of multiplications and additions affect power consumption and hardware complexity. When a substantial number of additions is necessary for the adder 16, the speed is limited by the material used and the number of delays (frequently referred to as the number of taps). For instance, in a commercially available matched filter wherein a CMOS is used, the total number of taps for the matched filter cannot exceed 64. The input sampling speed is 30 Mchips/s. (See G. J. R. Povey and P. M. Grant, "Simplified Matched Filter Receiver Design for Spread Spectrum Communication Application", Electronics & Communication Engineering Journal, April 1993.)

It is therefore an object of the present invention to provide a matched filter for a spread spectrum or CDMA system that does not have the shortcomings of conventional matched filters.

It is another object of the present invention to provide a matched filter for a SS or CDMA system that utilizes a differential value from the matched filter as its matched output of the filter.

It is a further object of the present invention to provide a differential matched filter for a SS or CDMA system that can save approximately half of the number of additions necessary.

SUMMARY OF THE INVENTION

In accordance with the present invention a differentially matched filter for a SS or CDMA system is provided.

In the first preferred embodiment, a differentially matched filter for SS or CDMA systems comprises a delay line, a multiplication stage, a first adder, a second adder and an additional delay element. The delay line comprises n elements of delay T with taps therebetween and is fed with an input sequence in the form of $$X_1, X_2, \ldots, X_{n-1}, X_n, X_{n+1}.$$

The taps of the delay line are connected to respective elements of the multiplication stage having filter coefficients in the form of $-a_n$, $(a_n-a_{n-1})$, $(a_{n-1}-a_{n-2})$, ..., $(a_2-a_1)$, $a_1$, where $a_1-a_n$ is a predetermined code sequence. The multiplication stage is in turn connected to the first adder to provide a sequence at the output thereof in the form of $$-a_n X_1 + (a_n-a_{n-1})X_2 + (a_{n-1}-a_{n-2})X_3 + \ldots + (a_2-a_1)X_n + a_1 X_{n+1}$$

The first adder is connected to a first input of the second adder, an output of the second adder is the output of the filter and is connected through the additional delay element to a second input of the second adder, to produce a differential output sequence in the form of $$a_n X_2 + a_{n-1} X_3 + \ldots + a_3 X_{n-1} + a_2 X_n + a_1 X_{n+1}.$$

The improved matched filter has more than half of its coefficients equal to 0 and therefore more than half of the total number of additions necessary for the conventional matched filter can be saved with resulting increase of the speed of the matched filtering.

A method of filtering spread signals at a receiving side of a transmission system having a transmitting side and the receiving side comprises, according to one aspect of the present invention, the steps of fixing a received sequence of spread signals in a delay line, the delay line comprising elements of delay, each subsequent element of delay of the elements of delay adding a delay time of T to a total delay time of preceding elements of the delay line; multiplying values of the received sequence by respective weighting coefficients constituting a second code sequence that is a replica to a first code sequence used for coding a baseband signal at the transmitting side of the system; adding together products of the step of multiplying, to produce an intermediate sequence; delaying the output sequence of the filter for a time of T; and adding the intermediate sequence from the delayed output sequence.

A second preferred embodiment of a differentially matched filter for spread spectrum or code division multiple access communication systems according to this invention comprises a delay line, a multiplication stage, a first adder, a second adder and an additional delay element. The delay line comprises at least $k=M(n+1)$ elements of delay with taps after every Mth element. The delay line is fed with an input sequence in the form of $$X_{1,1}, \ldots X_{1,M}, X_{2,1}, \ldots X_{2,M}, \ldots X_{n,1}, \ldots X_{n+1,1}.$$

Each of the taps is connected to a respective one of (n+1) elements of the multiplication stage, which in turn is fed with a sequence in the form of $$a_1, (a_2-a_1), \ldots, (a_n-a_{n-1}), -a_n.$$

This multiplication stage is connected to the first adder to provide a sequence at its output in the form of $$-a_n X_{1,1} + (a_n-a_{n-1})X_{2,1} + (a_{n-1}-a_{n-2})X_{3,1} + \ldots + (a_2-a_1)X_{n,1} + a_1 X_{n+1,1}.$$

The first adder is connected to a first input of the second adder. The output of the second adder is the output of the filter and is also connected through the additional delay element to a second input of the second adder, to produce a filter output sequence of the form $$\sum_{i=0}^{n-1} \sum_{j=1}^{M} a_{n-i} X_{i+2,j}.$$

Each of the delay line elements provides a delay equal to T/M, and the additional element of delay also provides a delay equal to T/M.

A method of filtering spread signals at a receiving side of a transmission system having a transmitting side and the receiving side comprises, according to the other aspect of the invention, the steps of fixing a received sequence of spread spectrum signals in a delay line consisting of elements of delay, with each element of delay of the delay line introducing a delay time of T/M; multiplying values of the received sequence tapped after each Mth element of delay by respective weighting coefficients, cooperatively constituting a second code sequence which is a replica to a first code sequence used for coding a baseband signal at the transmitting side of the system; adding together products of the multiplying, to produce an output sequence; delaying this output sequence for a time of T/M, to produce a delayed output sequence; and adding the output sequence to the delayed output sequence.

Other objects, features and advantages of the present invention, as well as its organization and operation will be understood from a consideration of the detailed description of the illustrative embodiment, which follows, when taken in conjunction with the accompanying drawings.

BRIEF DESCRIPTION OF THE DRAWINGS

FIG. 3 is a graph illustrating a conventional matched filter wherein the sampling speed is M×faster than that shown in FIG. 1.

FIG. 4 is a graph illustrating differential matched filter according to the present invention wherein the sampling speed is M× faster than that shown in FIG. 2.

DETAILED DESCRIPTION OF THE PREFERRED EMBODIMENT

Figure 2:
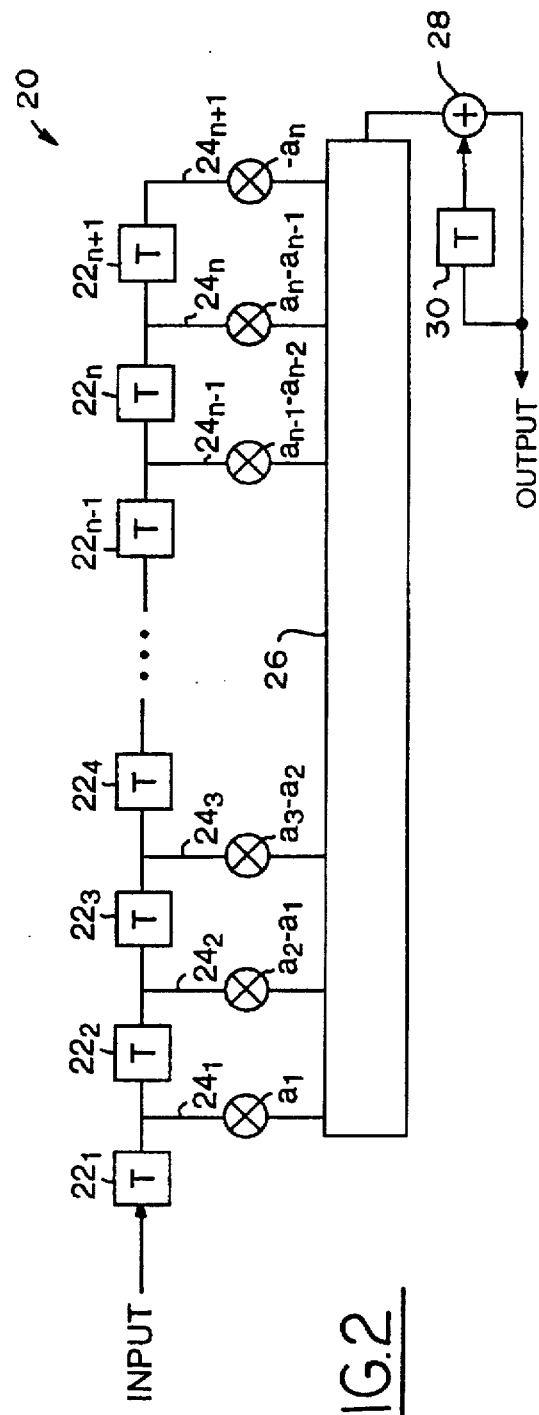
FIG. 2 is a diagram illustrating differential matched filter according to the present invention.

Referring now to FIG. 2, a matched filter 20 according to the present invention includes a delay line $22_1, 22_2, \ldots, 22_n$, $22_{n+1}$ with taps to a multiplication (weighting) stage $24_1$, $24_2, \ldots, 24_n, 24_{n+1}$, the latter being in turn connected to a first adder 26. First adder 26 has its output connected to one input of a second adder 28, and the output of second adder 28 which is the output of the filter 20 is at the same time coupled with an element 30 of delay T. The output of element 30 of delay is connected to another input of second adder 28. It can be appreciated that each block $22_i$ ($1 \leq i \leq n+1$) of delay line 22 adds a delay time of T to a total delay time provided by preceding elements $22_1$–$22_{i-1}$ of delay line 22; $X_1, X_2, \ldots, X_n, X_{n+1}$ represent in common a received sequences and $a_1 \ldots a_{n-1}$, $a_n$ is a random code sequence which is a replica of a random code sequence used at a transmitting side of a system (not shown) whose receiving side incorporates matched filter 20. Therefore, the output of first adder 26 can be expressed as $$-a_n X_1 + (a_n - a_{n-1}) X_2 + (a_{n-1} - a_{n-2}) X_3 + \ldots + (a_2 - a_1) X_n + a_1 X_{n+1}. \quad (1)$$

At the output of element 30 of delay, it becomes $$a_n X_1 + a_{n-1} X_2 + \ldots + a_2 X_{n-1} + a_1 X_n. \quad (2)$$

After addition, the output of second adder 28 will show $$a_n X_2 + a_{n-1} X_3 + \ldots + a_3 X_{n-1} + a_2 X_n + a_1 X_{n+1}. \quad (3)$$

Figure 1:
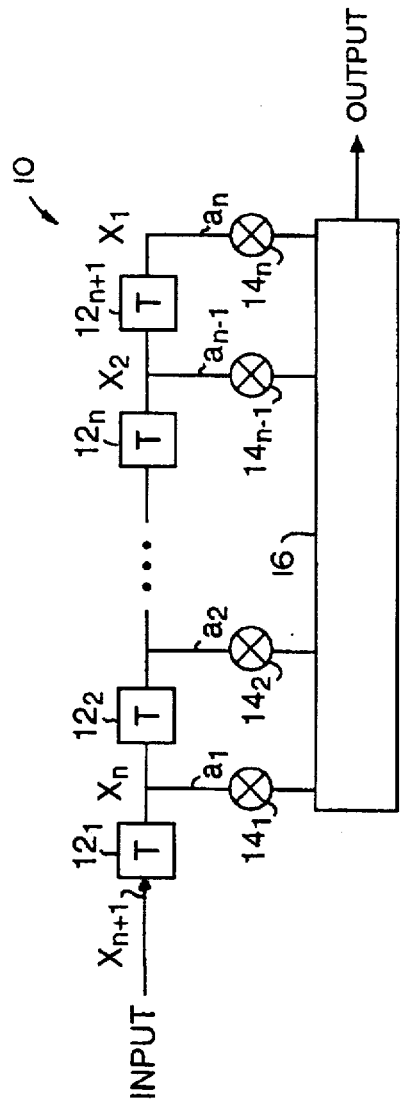
FIG. 1 is a circuit diagram showing a conventional matched filter device.

This output value is the same as that of conventional one shown in FIG. 1 for the same input sequence.

Since the value of $a_i$ is either 1 or $-1$, therefore, the value of $a_i - a_{i-1}$ is either 2, or 0, or $-2$.

One of the frequently used random sequence is m-sequence (or maximum length sequence). This sequence is defined in many books concerning spread spectrum or digital communication systems, for example "Digital Communications and Spread Spentruin Systems", by R. Z. Ziemen and R. L. Peterson, 1985, p. 385. A m-sequence has a period n, this n must be odd ($n = 2^r - 1$). For a m-sequence, $a_1', a_2', a_3', \ldots a_n'$ ($a_i' = 1$ or 0), by a direct value transformation 0 transferred to 1, and 1 transferred to $-1$, the other sequence $a_1, a_2, \ldots, a_n$ ($a_i = -1$ or 1) can be obtained. This new sequence corresponds to the coefficient of the matched filter mentioned in this invention.

Also, for any m-sequence with a period N, $N = 2^r - 1$, a run can be defined as a sequence of identical symbols within the m-sequence. And the length of this subsequence is the length of the run. Then, for this m-sequence, there will be 1 run of ones of the length r, 1 run of zeros of the length r–1

1 run of ones and 1 run of zeros of the length r–2, 2 runs of ones and 2 runs of zeros of the length r–3, 4 runs of ones and 4 runs of zeros of the length r–4, $2^{r-3}$ runs of ones and $2^{r-3}$ runs of zeros of the length 1.

There are total $2^{r-1}$ runs in this sequence. The $2^{r-1}$ runs are obtained by summation $2 + (1 + 2^2 + \ldots + 2^{r-3}) \cdot 2 = 2^{r-1}$. And the sequence $a_1, a_2, a_3, \ldots a_n$ obtained by a value transformation, mentioned above, from the m-sequence $a_1', a_2', a_3', \ldots a_n'$ also has a total of $2^{r-1}$ runs. Since this sequence has $2^{r-1}$ runs, the sequence $-a_n, a_n - a_{n-1}, a_{n-1} - a_{n-2}, \ldots, a_2 - a_1, a_1$ will have $2^{r-1} + 1$ nonzero values. The number of nonzero values of the matched filter coefficients means the number of additions in the calculation of a match process. There are total of n ($n = 2^{r-1}$) nonzero coefficients in the traditional match filter shown in FIG. 1. And there are total of $2^{r-1} + 1$ nonzero coefficients in the differential filter shown in FIG. 2. So, the ratio of the number of additions for the conventional matched filter and for the filter according to the present invention is $$(2^{r-1} + 1)/(2^r - 1) \approx \tfrac{1}{2}, \text{ for large } r.$$

The above calculation is based on the assumption that at the input of the filters 10 and 20 one sampling is taken at each random sequence of a bit. However, if M samples are taken for each random sequence of a bit, a conventional filter can be shown in FIG. 3.

The conventional matched filter 40 shown in FIG. 3 has a sampling speed which is M times higher than that of filter 10 in FIG. 1. It comprises a delay line 42 with elements of delay T/M, taps 44 to a multiplication stage 46, and an adder 48. A sequence at its output (the output of adder 48) can be described as $$\sum_{i=0}^{n-1} \sum_{j=1}^{M} a_{n-i} X_{i+1,j}$$

Based on this architecture, a differentially matched filter 50 according to the present invention and having a sampling speed which is M times higher than that of filter 20 shown in FIG. 2 can be seen in FIG. 4. It comprises a delay line with $k = M(n+1)$ elements $54_1$–$54_k$ of delay. Each of elements 54 provides a delay of T/M. There are taps $56_1$–$56_{n+1}$—after element $54_1$, and then in every M elements 54. Taps 56 are connected to a multiplication stage 58 comprising n+1 elements of multiplication. A random code sequence used for multiplication has the form of $$a_1, (a_2 - a_1), \ldots, (a_n - a_{n-1}), -a_n \quad (4)$$

This sequence is the same as that used in FIG. 2. Multiplication stage 58 is connected to a first adder 62. The output of first adder 62 shows a sequence of the form of $$-a_n X_{1,1} + (a_n - a_{n-1}) X_{2,1} + \ldots + (a_2 - a_1) X_{n,1} + a_1 X_{n+1,1}.$$

First adder is coupled to a second adder 64, and the second input of second adder 64 is fed from its output by virtue of an additional element 66 of delay of T/M. At the output of element 66, the sequence becomes $$\sum_{i=0}^{n-1} \sum_{j=1}^{M} a_{n-i} X_{i+2,j} + \sum_{i=0}^{n-1} a_{n-i} X_{i+1,1},$$

and at the output of second adder 64 it assumes the form $$\sum_{i=0}^{n-1} \sum_{j=1}^{M} a_{n-i} X_{i+2,j}.$$

The total number of additions required for the conventional filter shown in FIG. 3 is nM, while the total number of additions necessary for the differentially matched filter according to the present invention shown in FIG. 4 is $2^{r-1} + 1$ in the case of a m-sequence example. So, the ratio of the total number of additions between the two methods is shown below $$(2^{r-1} + 1)/(2^r - 1)M] \approx 1/(2M), \text{ for large } r.$$

The above therefore indicates that the ratio between the total number of additions between the present invention differentially matched filter and that of the conventional matched filter is 1/(2M), where M is the number of sampling for the random sequence of each bit.

While the present invention has been described in an illustrative manner, it should be understood that the terminology used is intended to be in the nature of words of description rather than of limitation.

Furthermore, while the present invention has been described in terms of a preferred embodiment thereof, it is to be appreciated that those skilled in the art will readily apply these teachings to other possible variations and modifications of the invention.

The embodiments of the invention in which an exclusive property or privilege is claimed are defined as follows.

What is claimed is:

1. A differentially matched filter for spread spectrum or code division multiple access communication systems comprising a delay line, a multiplication stage, a first adder, a second adder and an additional delay element, said delay line comprising at least n elements of delay with taps therebetween, said delay line being fed with an input sequence in the form of $$X_1, X_2, \ldots, X_{n-1}, X_n,$$

said taps being connected to respective elements of said multiplication stage, said multiplication stage being connected to said first adder to provide a sequence at the output thereof in the form of $$-a_n X_1 + (a_n - a_{n-1})X_2 + (a_{n-1} - a_{n-2})X_3 + \ldots + (a_2 - a_1)X_n + a_1 X_{n+1}.$$

where $a_1-a_n$ is a predetermined code sequence, said first adder being connected to a first input of said second adder, an output of said second adder being an output of said filter and being connected through said additional delay element to a second input of said second adder, to produce a filter output sequence of the form $$a_n X_2 + a_{n-1}X_3 + \ldots + a_3 X_{n-1} + a_2 X_n + a_1 X_{n+1}.$$

2. The differentially matched filter according to claim 1 wherein each of said delay line elements provides a delay equal to T, and said additional element of delay provides a delay equal to T.

3. A method of filtering spread spectrum signals at a receiving side of a transmission system having a transmitting side and said receiving side, said method comprising the steps of:

fixing a received sequence of spread spectrum signals in a delay line, said delay line comprising elements of delay, each element of delay of said delay line introducing a delay time of T;

multiplying values of said received sequence by respective weighting coefficients, said weighting coefficients constituting a second code sequence being a replica to a first code sequence used for coding a baseband signal at said transmitting side of said system;

adding together products of said multiplying, to produce an output sequence;

delaying said output sequence for a time of T, to produce a delayed output sequence; and adding said output sequence to said delayed output sequence.

4. A differentially matched filter for spread spectrum or code division multiple access communication systems comprising a delay line, a multiplication stage, a first adder, a second adder and an additional delay element, said delay line comprising at least k=M(n+1) elements of delay with taps after every Mth thereof, said delay line being fed with an input sequence in the form of $$X_{1,1}, \ldots X_{1,M}, X_{2,1}, \ldots X_{2,M}, \ldots X_{n,1}, \ldots X_{n+1,1},$$

each of said taps being connected to a respective one of (n+1) elements of said multiplication stage, said multiplication stage being fed with a sequence in the form of $$a_1, (a_2-a_1), \ldots, (a_n-a_{n-1}), -a_n$$

said multiplication stage being connected to said first adder to provide a sequence at the output thereof in the form of $$-a_n X_{1,1} + (a_n - a_{n-1})X_{2,1} + (a_{n-1} - a_{n-2})X_{3,1} + \ldots + (a_2 - a_1)X_{n,1} + a_1 X_{n+1,1},$$

said first adder being connected to a first input of said second adder, an output of said second adder being an output of said filter and being connected through said additional delay element to a second input of said second adder, to produce a filter output sequence of the form $$\sum_{i=0}^{n-1} \sum_{j=1}^{M} a_{n-i} X_{i+2,j}.$$

5. The differentially matched filter according to claim 4 wherein each of said delay line elements provides a delay equal to T/M, and said additional element of delay provides a delay equal to T/M.

6. A method of filtering spread spectrum signals at a receiving side of a transmission system having a transmitting side and said receiving side, said method comprising the steps of:

fixing a received sequence of spread spectrum signals in a delay line, said delay line comprising elements of delay, each element of delay of said delay line introducing a delay time of T/M;

multiplying values of said received sequence tapped after each Mth element of delay by respective weighting coefficients, said weighting coefficients constituting a second code sequence being a replica to a first code sequence used for coding a baseband signal at said transmitting side of said system;

adding together products of said multiplying, to produce an output sequence;

delaying said output sequence for a time of T/M, to produce a delayed output sequence; and adding said output sequence to said delayed output sequence.

* * * * *